(12) United States Patent
Akimoto et al.

(10) Patent No.: US 6,264,705 B1
(45) Date of Patent: Jul. 24, 2001

(54) PROCESSING SYSTEM

(75) Inventors: Masami Akimoto; Issei Ueda, both of Kumamoto (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 09/472,199

(22) Filed: Dec. 27, 1999

Related U.S. Application Data

(63) Continuation of application No. 08/972,150, filed on Nov. 17, 1997, now Pat. No. 6,126,703.

(30) Foreign Application Priority Data

Nov. 19, 1996 (JP) .................................................. 8-323403

(51) Int. Cl.$^7$ .............................. H01L 21/00; H01L 21/64
(52) U.S. Cl. ............................................................ 29/25.01
(58) Field of Search ............................................. 29/25.01

(56) References Cited

U.S. PATENT DOCUMENTS

| | | | |
|---|---|---|---|
| 4,584,045 | * | 4/1986 | Richards . |
| 4,917,556 | | 4/1990 | Stark et al. . |
| 4,923,054 | * | 5/1990 | Ohtani et al. ............................ 414/331 |
| 5,024,570 | | 6/1991 | Kiriseko et al. . |
| 5,061,144 | * | 10/1991 | Akimoto et al. . |
| 5,131,799 | | 7/1992 | Nishi et al. . |
| 5,202,716 | * | 4/1993 | Tateyama et al. ....................... 414/217 |
| 5,339,128 | | 8/1994 | Tateyama et al. . |
| 5,442,416 | * | 8/1995 | Tateyama et al. . |
| 5,571,325 | | 11/1996 | Ueyama et al. . |
| 5,664,254 | | 9/1997 | Ohkura et al. . |
| 5,788,868 | | 8/1998 | Itaba et al. . |
| 5,803,932 | * | 9/1998 | Akimoto et al. ........................ 29/25.01 |
| 5,826,129 | * | 10/1998 | Hasebe et al. .......................... 414/225 |

FOREIGN PATENT DOCUMENTS

| | | | |
|---|---|---|---|
| 61-123150 | * | 6/1986 | (JP) . |
| 7-164273 | | 6/1995 | (JP) . |
| 7-297258 | | 11/1995 | (JP) . |

OTHER PUBLICATIONS

Patent Abstracts of Japan, vol. 1997, No. 07, Jul. 31, 1997, JP 09 074127, Mar. 18, 1997, (with Corr, US 5,788,868).
Patent Abstracts of Japan, vol. 012, No. 072 (E–588), Mar. 5, 1988, JP 62 213259, Sep. 19, 1987.
Patent Abstracts of Japan, vol. 016, No. 553 (M–1339), Nov. 24, 1992, JP 04 209110, Jul. 30, 1992.

* cited by examiner

*Primary Examiner*—David E. Graybill
(74) *Attorney, Agent, or Firm*—Oblon, Spivak, McClelland, Maier & Neustadt, P.C.

(57) ABSTRACT

A processing system includes a plurality of types of internal processing machines that perform various processes on a semiconductor substrate and an interface section that delivers and receives the semiconductor substrate to and from an external exposure machine for performing an exposure process on the substrate subjected to a resist coating process, wherein the interface section includes a transfer unit for taking in the substrate subjected to a specific process from at least one of the internal processing machines and transferring the substrate and a substrate table unit for temporarily holding the substrate to transfer the substrate between the internal processing machine and the external exposure machine via the transfer unit. The substrate table unit has first and second tables that are laid one on top of the other and can move up and down and stop at a specific height, the first table allowing the substrate to be temporarily placed on it in transferring the substrate to the external exposure machine, and the second table allowing the substrate to be temporarily placed on it in receiving the substrate from the external exposure machine. The transfer unit transfers the substrate between the first and second tables and at least one of the processing machines.

20 Claims, 9 Drawing Sheets

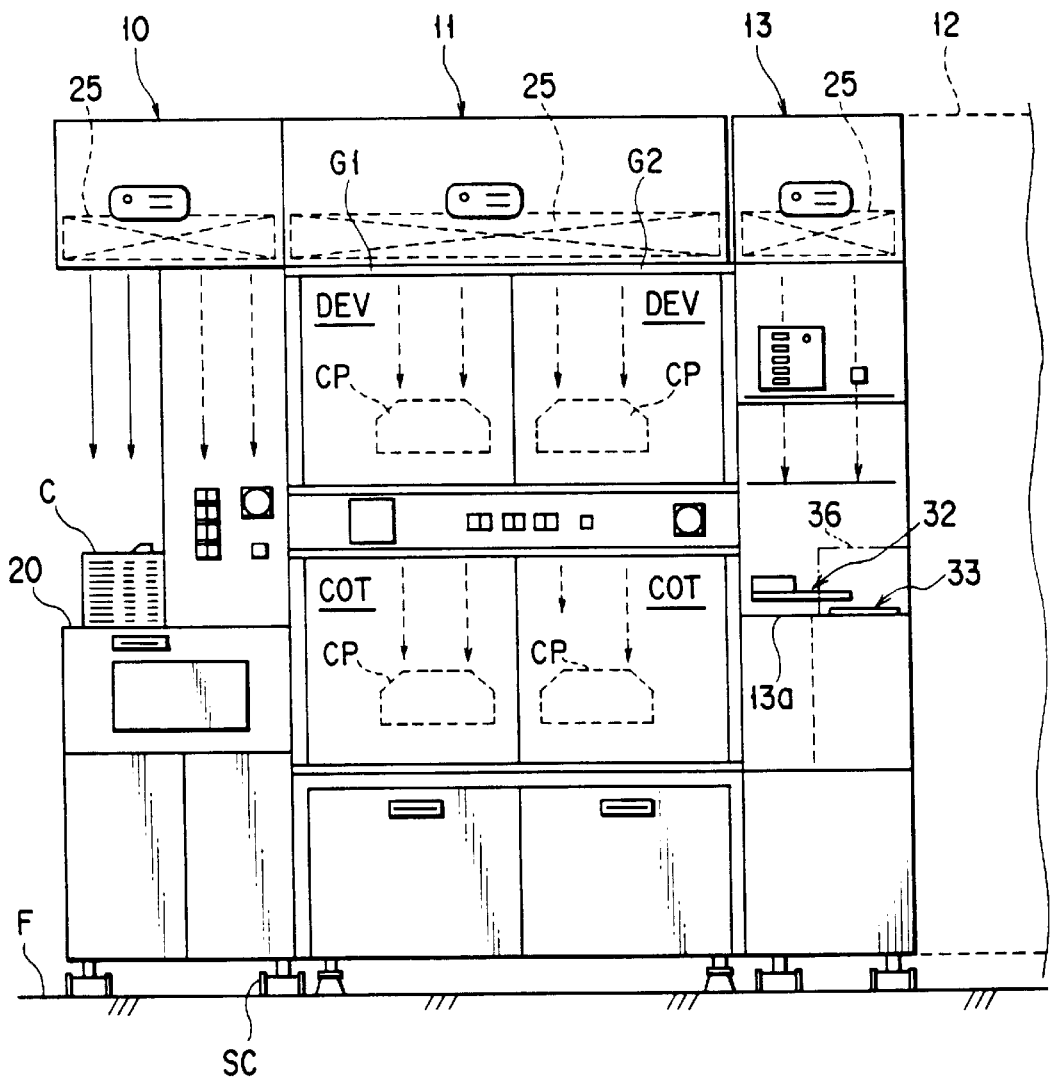
F I G. 2

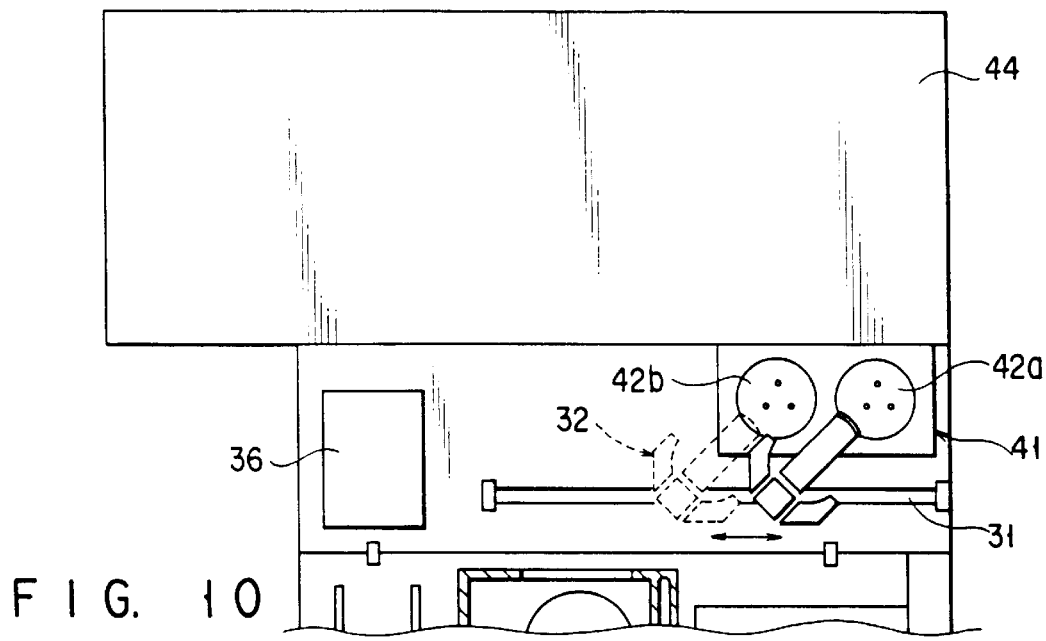
F I G. 10
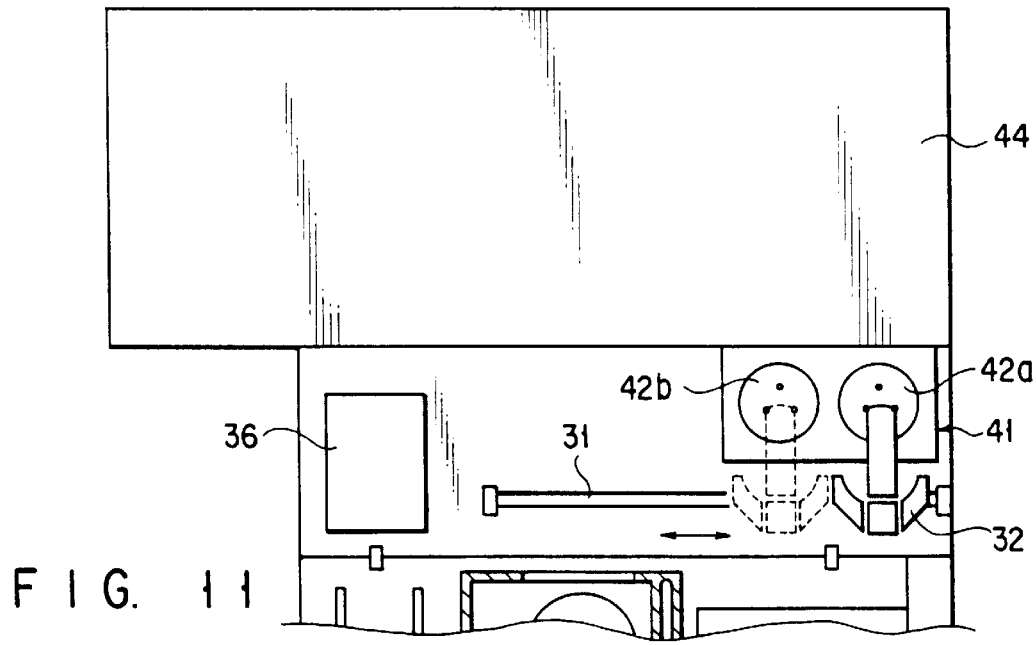
F I G. 11

PROCESSING SYSTEM

This application is a continuation of application Ser. No. 08/972,150, filed on Nov. 17, 1997, U.S. Pat. No. 6,126,703.

BACKGROUND OF THE INVENTION

In the photoresist processing step in, for example, the manufacture of semiconductor devices, a substrate, such as a semiconductor wafer (hereinafter, referred to as a wafer), is washed and the surface of the wafer is coated with a photoresist solution to form a photoresist film. After the photoresist film is exposed using a specific pattern, the exposed film is developed with a developing solution. To carry out such a series of processes in the photoresist processing step, a photoresist coating and developing system has been used.

The photoresist coating and developing system includes a cassette table on which a plurality of cassettes are placed in alignment and a transfer mechanism that takes out one of the wafers from the cassette table and conveys it to a main transfer arm. The cassettes are each a container for housing a plurality of wafers. The transfer mechanism can move freely over a transfer path laid in the direction of cassette arrangement (in the direction of X). Various processing machines that perform specific processes on a wafer are arranged on both sides of the transfer path for the main transfer arm. Specifically, on both sides of the transport path, there are provided a brushing machine for brushing a wafer while turning it, a washing machine for washing a wafer W with a high-pressure jet of water, an adhesion processing machine for improving the fixation of resist by subjecting the surface of the wafer to an adhesion process, a cooling machine for cooling the wafer to a specific temperature, a photoresist coating machine for coating the surface of the rotating wafer with a resist solution, a heater for heating the photoresist-coated wafer or the pattern-exposed wafer, and a developing machine for developing the exposed wafer by supplying a developing solution to the wafer's surface, while rotating the wafer.

There is also provided an interface section that transfers the wafer on which the specific photoresist film has been formed to a pattern exposure machine (i.e., optical stepper) located outside the photoresist coating and developing system. The interface section includes a table section on which the wafer transported by the main transfer arm is to be placed, and a wafer passing mechanism for conveying the wafer between the table section and the loading/unloading section of the exposure machine. The wafer passing mechanism has a similar function to that of the transfer mechanism. That is, it can not only move along the transfer path (in the direction of X), but also move back and forth in the direction of Y and rotate in the direction of θ in an X-Y plane.

In the conventional photoresist coating and developing system, the loading of an unexposed wafer into the exposure machine and the unloading of the exposed wafer from the exposure machine are effected through the loader/unloader section in the exposure machine.

In recent years, various types of exposure machines have been developed. Some of them have a suitable loading/unloading arm instead of a loader/unloader section in their exposure machine. The loading/unloading arm in the exposure machine is designed to advance to and retreat from the interface section and thereby load the wafer in the interface section into the exposure machine and returns the exposed wafer in the machine to the interface section.

The conventional processing system, however, cannot deal with the exposure machine constructed as described above. Because the pattern exposure machine is installed outside the processing system, the height of the system and that of the exposure device have to be adjusted for a smooth transfer of a wafer between them. This type of processing system is designed to perform a series of processes within the system as much as possible by adding various functions to the system. At the same time, it is desirable that the necessary installation space should be as small as possible. In the future, as the diameter of a wafer, a substrate, will get larger, minimizing the necessary installation space will probably be a pressing need.

BRIEF SUMMARY OF THE INVENTION

The object of the present invention is to provide a processing system capable of not only dealing with transfer means, such as various types of transfer arms in an external machine but also realizing smooth transfer and saving the installation space.

According to a first aspect of the present invention, there is provided a processing system comprising a plurality of types of internal processing machines that perform various processes on a substrate, and an interface section that delivers and receives the substrate to and from an external processing machine for performing a specific process on the substrate, wherein the interface section includes a transfer unit for taking in the substrate from at least one of the internal processing machines and transferring the substrate to the external processing machine and a substrate table unit for temporarily holding the substrate in transferring the substrate between the internal processing machine and the external processing machine via the transfer unit. The substrate table unit has first and second tables that are laid one on top of the other and can move up and down and stop at a specific height, the first table allowing the substrate to be temporarily placed on it in transferring the substrate to the external processing machine, the second table allowing the substrate to be temporarily placed on it in receiving the substrate from the external processing machine. The transfer unit transfers the substrate between the first and second tables and at least one of the internal processing machines.

In the interface section of the processing system, the first table used in transferring the processed substrate to the external processing machine and the second table used in receiving the substrate from the external processing machine are provided independently in the substrate table unit, which enables the transfer unit in the external processing machine to transfer the substrate smoothly. Furthermore, because the first table and second table are laid one on top of the other and the substrate table unit on which those wafer tables are installed can move up and down freely, the substrate can be loaded onto and unloaded from the first wafer table and second wafer table in the same delivery position. The arrangement of the first and second tables helps minimize the space necessary for the installation of the system.

According to a second aspect of the present invention, there is provided a processing system comprising a plurality of types of internal processing machines that perform various processes on a substrate, and an interface section that delivers and receives the substrate to and from an external processing machine for performing a specific process on the substrate, wherein the interface section includes a transfer unit for taking in the substrate from at least one of the internal processing machines and transferring the substrate to the external processing machine and a substrate table unit for temporarily holding the substrate in transferring the substrate between the internal processing machine and the external processing machine via the transfer unit. The substrate table unit has first and second tables that are laid one on top of the other and can move up and down and stop at a specific height. Each of the first and second tables has two placement tables side by side that allow two substrates to be temporarily placed on them in transferring a substrate between the external processing machine and the internal processing machine. The transfer unit transfers the substrate between the first and second tables and at least one of the internal processing machines.

In the processing system of the second aspect, each of the upper stage and lower stage of the substrate table unit has the first and second tables side by side. This enables the transfer unit in the external processing machine to deliver the unprocessed substrate to the external processing machine and receives the processed substrate from the external processing machine by means of the same substrate table unit at the same height. When the processing tact time on the system side differs from that on the external processing machine side, the substrate table unit can be moved up and down suitably to place the substrate on any empty table, thereby allowing the substrate to wait for processing.

When at least either the first table or the second table is designed to accommodate two or more substrates, an empty table can be used as a standby area in the processing system of the first aspect, and the number of standby areas is increased in the processing system of the second aspect.

When the first wafer table or second wafer table is designed to further perform an exposure process on the substrate, for example, a peripheral exposure process on a substrate, such as a semiconductor wafer, this will not only allow the processing space to be used for two different types of exposure but also enable the processes ranging from the peripheral exposure process to the pattern exposure process or from the pattern exposure process to the peripheral exposure process to be carried out speedily.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments give below, serve to explain the principles of the invention.

FIG. 2 is a schematic front view of the coating and developing system of FIG. 1;

FIG. 10 is a schematic plan view of the interface section when the wafer passing mechanism is accessing obliquely to the substrate table unit of FIG. 7; and FIG. 11 is a schematic plan view of the interface section when the wafer passing mechanism is accessing the substrate table section of FIG. 7 face-to-face.

DETAILED DESCRIPTION OF THE INVENTION

Figure 1:
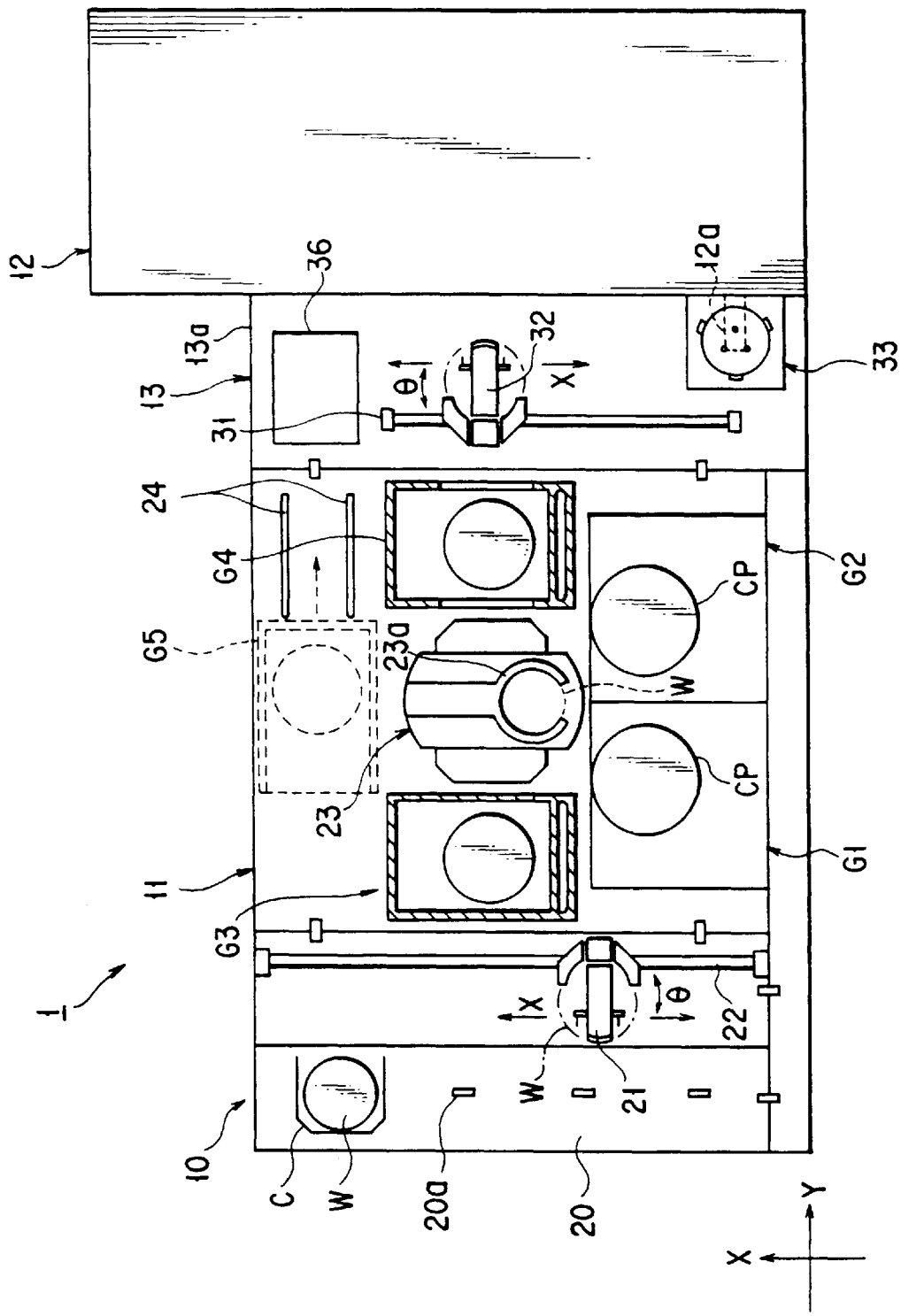
FIG. 1 is a schematic plan view of a coating and developing system according to an embodiment of the present invention.

A coating and developing system 1 according to an embodiment of the present invention will be explained by reference to FIGS. 1 to 3.

The coating and developing system 1 comprises a cassette station 10, a processing station 11, and an interface station 13. In the system, these component parts are connected to each other to form an integral structure.

The cassette station 10 loads and unload wafers W (or substrates) into and from the system in units of a cassette C, for example, in units of 25 wafers. The cassette station also loads and unloads a wafer W into or from the cassette C. The processing station 11 has various processing machines of the sheeting type that perform specific processes on wafers W one by one in the coating and developing processes. The processing machines are provided in specific positions in a multistage manner. The interface section 13 delivers a wafer W to a pattern exposure machine 12 adjacent to the processing station 11. The exposure machine is located outside the system.

In the cassette station 10, a plurality of cassettes C (e.g., four cassettes) are placed in a line in positioning projections 20a on a cassette table 20 serving as a table unit in the direction of X shown in FIG. 1, with the wafer inlet and outlet of each wafer cassette facing the processing station 11 as shown in FIG. 1. A wafer carriage 21 can move in the direction of cassette arrangement (i.e., in the direction of X) and in the direction of wafer arrangement (i.e., in the direction of Z, i.e., vertical direction). The wafer carriage 21 can move along a transfer path 22 and selectively access one of the cassettes C.

The wafer carriage 21 can rotate in the direction of θ. The carriage is also able to access an alignment unit (ALIM) and an extension unit (EXT) belonging to the multistage unit section of a third processing unit group G3 on the processing station 11's side, as explained later.

The processing station 11 has main transfer means (i.e., a main wafer transfer machine) 23 in its center. Around the main wafer transfer machine, one or more groups of processing machines are arranged. Each group is made up of various processing machines arranged in a multistage manner.

In the coating and developing system 1 of the embodiment, five processing machine groups G1, G2, G3, G4, and G5 can be arranged. A first and second processing machine groups G1 and G2 are arranged in the front of the system (i.e., in the lower part of FIG. 1). A third processing machine group G3 is arranged adjacent to the cassette station 10. A fourth processing machine group G4 is put adjacent to the interface section 13. As an option, a fifth processing group G5 is arranged at the back of the system.

As shown in FIG. 2, in the first processing machine group G1, two spinner-type processing machines are arranged one on top of the other. They perform specific processes on the wafer W on a spin chuck in a cup CP. For example, they are a photoresist coating machine (COT) and a developing machine (DEV) laid one on top of the other in that order from the bottom. Similarly, in the second processing machine group G2, two spinner-type processing machines, for example, a photoresist coating machine (COT) and a developing machine (DEV) laid one on top of the other in that order from the bottom. It is desirable that the photoresist coating machine (COT) should be placed at the lower stage, since the discharging of the photoresist solution is a difficult problem in terms of structure and maintenance. The photoresist coating machine (COT), however, may be placed at the upper stage as the need arises.

Figure 3:
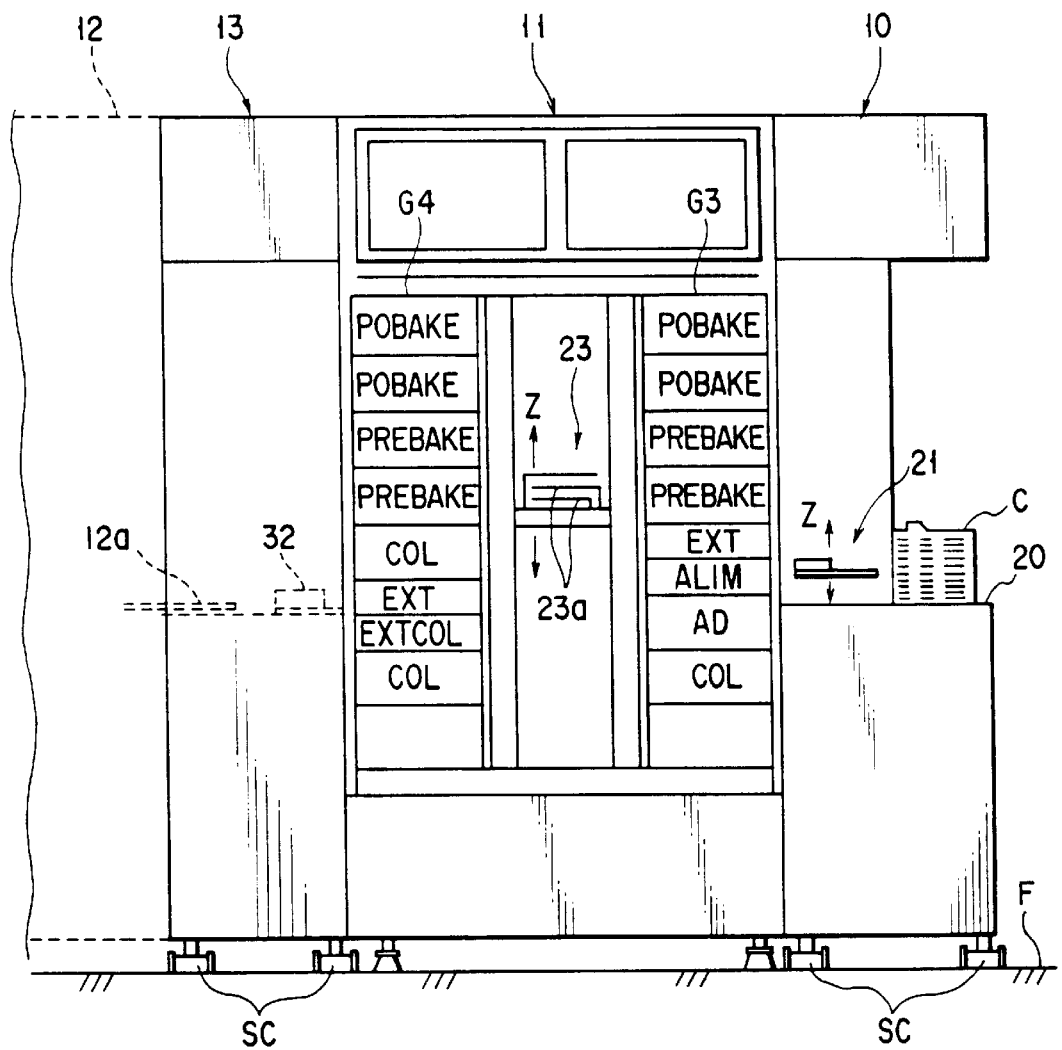
FIG. 3 is a schematic rear view of the coating and developing system of FIG. 1.

In the third processing machine group G3, open-type processing machines are laid one on top of another in eight stages as shown in FIG. 3. These machines perform specific processes on the wafer W on a table (not shown). For example, in the third processing machine group G3, a cooling machine (COL) for cooling the wafer, an adhesion processing machine (AD) for improving the fixation of resist by dehydrating the surface of the wafer, an alignment machine (ALIM) for aligning the wafer, an extension machine (EXT), two pre-baking machines (PREBAKE) for heating the wafer before exposure, and two post-baking machines (POBAKE) for heating the wafer after exposure are laid one on top of another in that order from the bottom.

Similarly, in the fourth processing machine group G4, open-type processing machines are laid one on top of another in eight stages. For example, in the fourth processing machine group G4, a cooling machine (COL), an extension/cooling machine (EXTCOL), an extension machine (EXT), a cooling machine (COL), two pre-baking machines (PREBAKE), and two post-baking machines (POBAKE) are laid one on top of another in that order from the bottom.

Thermal interference between the machines can be reduced by arranging the cooling machine (COL) and the extension/cooling machine (EXTCOL), whose processing temperatures are low, at the lower stages and the pre-baking machines (PREBAKE), post-baking machines (POBAKE), and adhesion processing machine (AD), whose processing temperatures are high, at the upper stages.

In the coating and developing system 1, the fifth processing machine group G5 represented by a broken line can be arranged at the back of the main transfer machine 23 as described above. The multistage processing machine in the fifth processing machine group G5 can move sideward along a guide rail 24 when viewed from the main wafer transfer machine 23. Therefore, even when the multistage processing machine in the fifth processing machine group G5 is provided at the back of the main wafer transfer machine 23 as shown in the figure, sliding the fifth processing machine group G5 along the guide rail 24 secures a space at the back of the main wafer transfer machine 23, which facilitates the maintenance of the main wafer transfer machine 23 from behind the system. Instead of sliding linearly along the guide rail 24, the multistage processing machine in the fifth processing machine group G5 may turn outward from the system as shown by dot-dash lines in FIG. 1. The pivotal movement also makes it easy to secure a space for the maintenance of the main wafer transfer machine 23.

Because the main wafer transfer machine 23 can not only move vertically but also rotate in the direction of θ, it can access each unit in the first to fifth processing machine groups G1, G2, G3, G4, and G5. The main wafer transfer machine 23 has three pairs of tweezers 23a that hold a wafer directly. The three pairs of tweezers are laid one on top of another. Using any pair of tweezers 23a, the main wafer transfer machine can load and unload a wafer into or from each machine in the first to fifth processing machine groups G1, G2, G3, G4, and G5.

In the coating and developing system 1, to make a down flow of clean air toward the cassette table 20, the transfer path 22 of the wafer carriage 21, the first to fifth processing machine groups G1, G2, G3, G4, and G5, and the interface section 13, a filter unit 25 composed of a high-performance filter, such as a ULPA filter (Ultra Low Penetrate Air filter), or a chemical filter is provided in each of the cassette station 10, processing station 11, and interface section 13 in the upper part of the system as shown in FIG. 2. When the air supplied from the upstream side of the filter unit 25 passes through the filter unit 25, particles and organic components are removed from the air and the air makes a down flow of clean air as shown by solid lines and broken lines in FIG. 2. In order that a down flow of clean air may be particularly formed in the photoresist coating machine (COT) and developing machine (DEV) where organic components are produced, ducts are installed in these machines.

Figure 4:
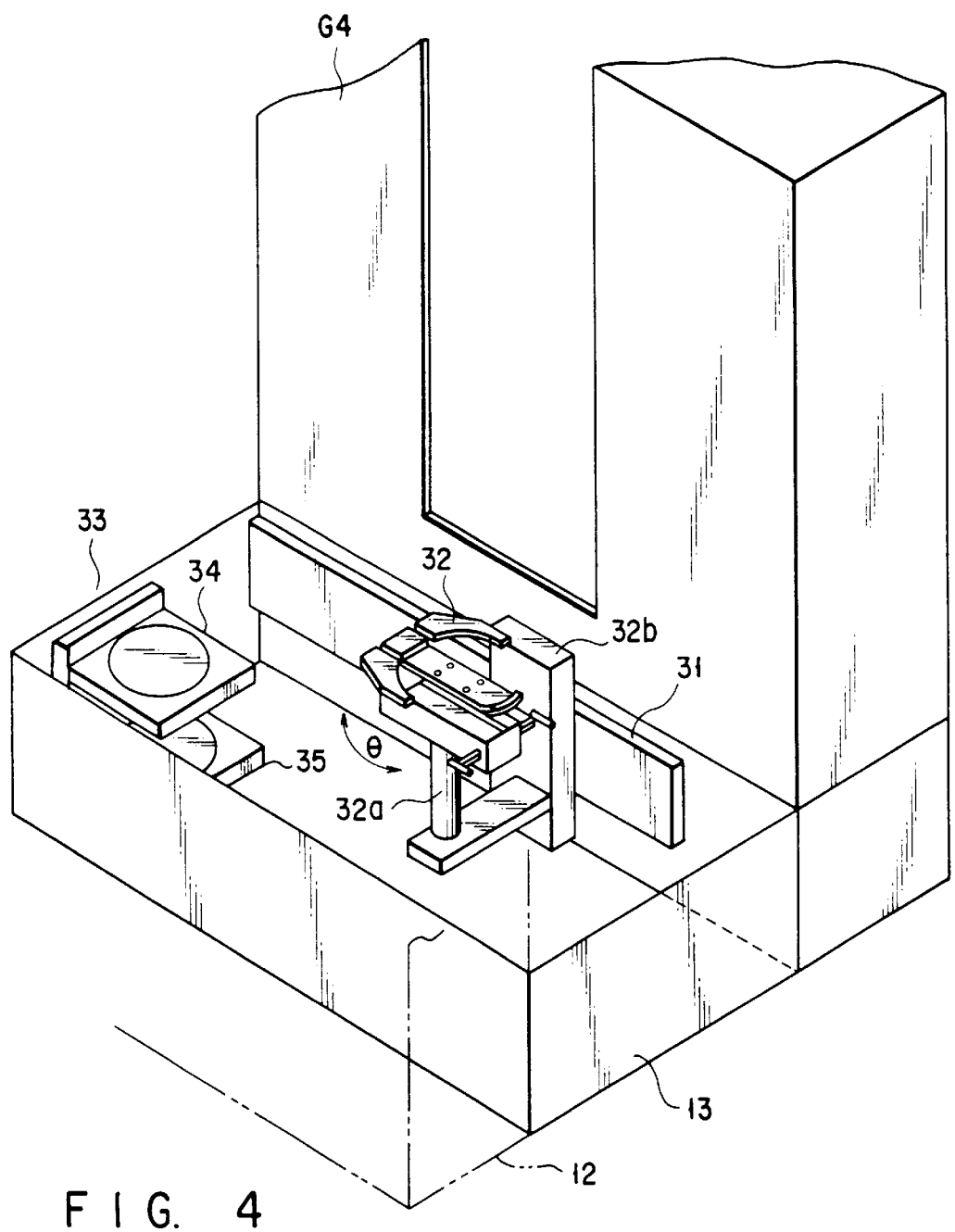
FIG. 4 is a perspective view of an interface section.

The interface section 13 has the same length in the direction of depth (in the direction of X) as that of the processing station 11 but is shorter in the direction of width. On the base 13a of the interface section 13, there is provided wafer transfer means (i.e., a wafer carriage) 32 that can move freely along a transfer path 31 laid in the direction of X. The wafer carriage 32 can not only rotate in the direction of θ by means of a shaft 32a as shown in FIG. 4 but also access the extension machine (EXT) belonging to the fourth processing machine group G4 in the processing station 11. The wafer carriage 32 can access a first table 34 and a second table 35 obliquely, not face-to-face.

Figure 5A:
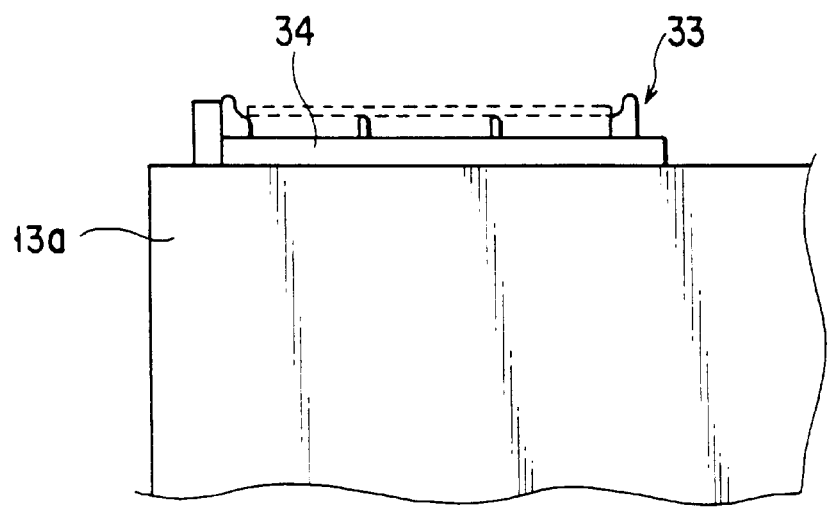
FIG. 5A is a side view of the substrate table unit in the coating and developing system of FIG. 1.
Figure 5B:
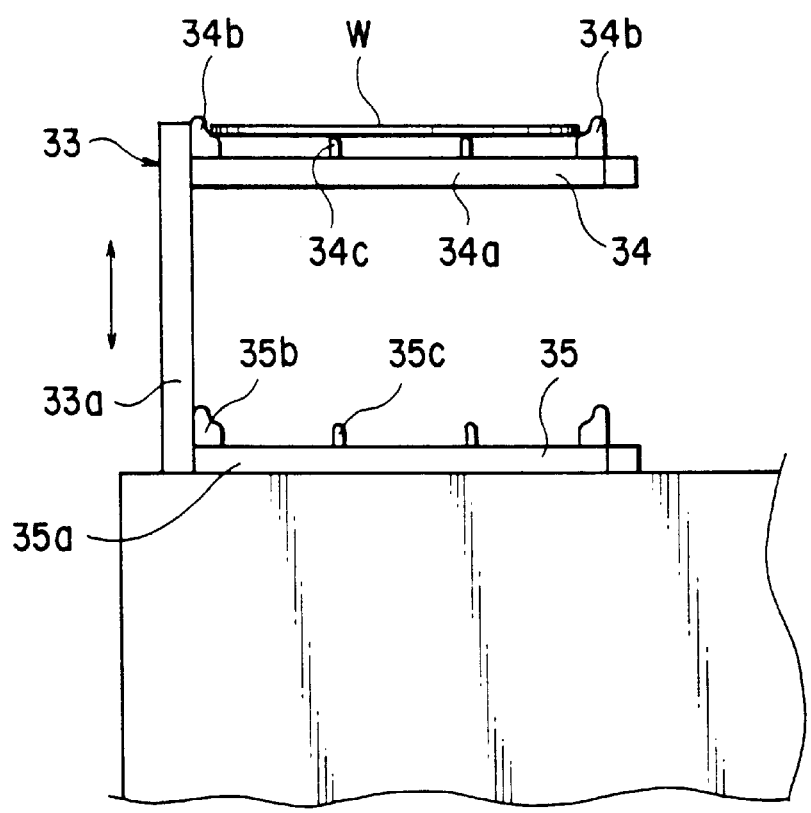
FIG. 5B is a side view of the interface section when the substrate table unit of FIG. 4 has risen.

In the interface section 13, a substrate table unit 33 is provided in the front of the base 13a and at its one end close to the exposure device 12. As shown in FIGS. 4, 5A and 5B, the substrate table unit 33 has a first wafer table 34 at the upper stage and a second wafer table 35 at the lower stage. It can make an up-and-down movement by means of a suitable driving mechanism (not shown) and stop at any height. The substrate table unit 33 is located in a position where the transfer arm 12a, serving as the transfer means of the exposure machine 12, can access the table unit. Specifically, the substrate table unit is located in such a position as enables the transfer arm 12a to receive the wafer placed in the specific place of the substrate table unit 33 or place the transferred wafer W in a specific place of the substrate table unit 33.

The first wafer table 34 has basically the same structure as that of the second wafer table 35. A detailed explanation of the first wafer table 34 will be given. The first wafer table 34 includes a support base 34a part of which is fixed to an up-and-down support means (i.e., an elevator post) 33a that moves up and down by means of the driving mechanism, a plurality of periphery support members 34b that are provided on the support base 34a and support the periphery of the wafer W, and a suitable number of support pins 34c provided in the vicinity of the center of the support base 34a. As shown in FIG. 5B, the support pins 34c support the wafer W in the vicinity of the wafer's center and the periphery support members 34b support the wafer's periphery. Being supported this way, the wafer is placed on the first wafer table 34. Similarly, the second wafer table 35 includes a support table 35*a*, periphery support members 35*b*, and support pins 35*c*.

A peripheral exposure machine 36 that performs a peripheral exposure process on the wafer W is provided at the end of the base 13*a* of the interface section 13 opposite to the substrate table unit 33, specifically at the back of the system. The wafer carriage 32 can also access the peripheral exposure machine 36.

In the coating and developing system 1, although the processing station 11 is fixed on the floor F as shown in FIGS. 2 and 3, the cassette station 10 and interface section 13 can slide in the direction of X in FIG. 1. This is achieved by providing a slide caster SC on the bottom surface of each of the cassette table 20 and the base 13*a* of the interface section 13. The same thing may be achieved by laying suitable rails on the floor F beforehand and providing a slide mechanism or wheels that can slide over the rails, on the bottom surface of each of the cassette table 20 and the base 13*a*.

Hereinafter, the operation of the coating and developing system 1 constructed as described above will be explained. First, in the cassette station 10, the wafer carriage 21 accesses a cassette C that houses unprocessed wafers on the cassette table 20 and takes out a wafer W from the cassette C. Then, the wafer carriage 21 moves to the alignment machine (ALIM) located in the multistage machine in the third processing machine group G3 of the processing station 11 and delivers the wafer W to the alignment machine (ALIM).

After the orientation flat alignment and centering of the wafer W have been completed, the aligned wafer W is received by the main wafer transfer machine 23. The main wafer transfer machine 23 move to the front of the adhesion processing machine (AD) located at the lower stage of the alignment machine (ALIM) in the third processing machine group G3 and loads the wafer W into the adhesion processing machine. Then, the main wafer transfer machine 23 loads the wafer into the cooling machine (COL) belonging to the multistage machine in the third processing machine group G3 or the fourth processing machine group G4. The wafer W is heated to the setting temperature before the photoresist coating process, for example, 23° C. in the cooling machine (COL).

After the cooling process has been completed, the main wafer transfer machine 23 unloads the wafer W from the cooling machine (COL), replaces it with another wafer W held therein, and loads the cooled wafer W into the photoresist coating machine (COT) belonging to the multistage machine in the first processing machine group G1 or the second processing machine group G2. In the photoresist coating machine (COT), the wafer W is coated with a photoresist solution by a spin coating method to form a thick film on the wafer's surface.

After the photoresist coating process has finished, the wafer main transfer machine 23 unloads the wafer W from the photoresist coating machine (COT) and loads it into the pre-baking machine (PREBAKE). In the pre-baking machine (PREBAKE), the wafer W is heated at a specific temperature, for example, 100° C. for a specific time to evaporate the remaining solvent from the coated film on the wafer W.

After the pre-baking has been completed, the main wafer transfer machine 23 unloads the wafer W from the pre-baking machine (PREBAKE) and loads it into the extension/cooling machine (EXTCOL) belonging to the multistage machine in the fourth processing machine group G4. In the extension/cooling machine (EXTCOL), the wafer W is cooled to a temperature suitable for the next step, that is, the peripheral exposure process at the peripheral exposure machine 36, for example, to 24° C. After the cooling has ended, the main wafer transfer machine 23 transfers the wafer to the extension machine (EXT) just above and places the wafer W on a specific table (not shown) in the extension machine (EXT).

When the wafer is placed on the table of the extension machine (EXT), the wafer carriage 32 of the interface section 13 accesses the table from the opposite side and receives the wafer W. The wafer carriage 32 loads the wafer W into the peripheral exposure machine 36 of the interface section 12. The peripheral exposure machine 36 performs an exposure process on the periphery of the wafer W.

Figure 6:
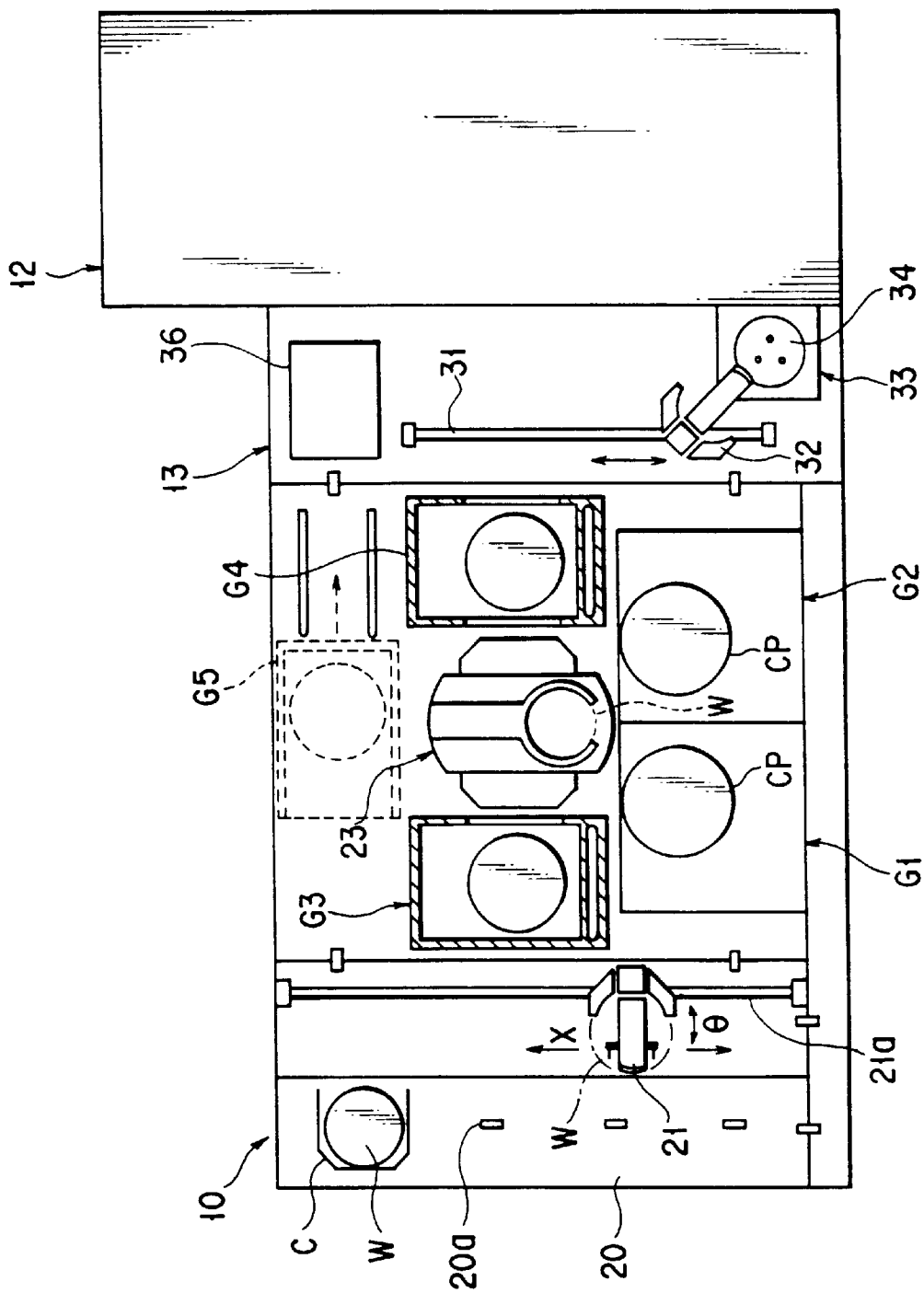
FIG. 6 is a schematic plan view of the coating and developing system of FIG. 1 when the wafer passing mechanism is accessing the substrate table unit.

After the peripheral exposure process has been completed, the wafer carriage 32 unloads the wafer W from the peripheral exposure machine 36 and places the wafer W on the first wafer table 34 at the upper stage of the substrate table unit 33. The wafer carriage 32 moves over the transfer path 31 along the substrate table unit and places the wafer on the first wafer table 34 in a specific position on the transfer path. In this case, the wafer carriage 32 accesses the first wafer table 34 obliquely, not face-to-face, and places the wafer W on the first wafer table 34 as shown in FIG. 6. In other words, the step motor provided on the drive mechanism 32*b* shown in FIG. 4 is controlled by the control signal from a controller (not shown) so that the arm 21 of the wafer carriage 32 can access the first wafer table 34 obliquely. By this oblique access, the wafer W is placed on the first wafer table 34 faster than when the wafer carriage 32 is moved to the face-to-face position with the first wafer table 34.

Thereafter, the substrate table unit 33 rises as shown in FIG. 5B and waits for the transfer arm 12*a* of the exposure machine 12 to access the unit. Specifically, the substrate table unit waits for the transfer arm 12*a* of the exposure machine 12 to transfer the wafer W subjected to the specific pattern exposure process at the exposure machine 12. After the transfer arm 12*a* of the exposure machine 12 has placed the exposed wafer W on the second wafer table 35 and temporarily retreated, the substrate table unit 33 goes down to the position shown in FIG. 4.

Then, the transfer arm 12*a* of the exposure machine 12 receives the wafer W that is placed on the first wafer table 34 and waits for pattern exposure. The transfer arm then retreats into the exposure machine 12, which performs a specific pattern exposure process on the wafer W.

After the wafer W on the first wafer table 34 has been transferred by the transfer arm 12*a* as described above, the substrate table unit 33 rises again to the position shown in FIG. 5. The wafer carriage 32 receives the exposed wafer W on the second table 35 and transfers it to the extension machine (EXT). Then, for the next process, for example, a post-exposure baking process, the wafer is transferred by the main wafer transfer machine 23 to the post-baking machine (POBAKE). Thereafter, the wafer is subjected to specific processes one after another.

As seen from the above-described processes, in the coating and developing system 1 of the embodiment, even if the exposure machine 12, an external processing machine, has its own transfer arm 12*a*, the arm can transfer a wafer W smoothly between the system and the exposure machine via the substrate table unit 33 of the interface section 13.

The substrate table unit 33 that relays the transfer has the first wafer table 34 on which the wafer W transferred from the system is placed, or the OUT-side wafer table, at the upper stage, and the second wafer table 35 on which the wafer to be transferred to the system is placed, or the IN-side wafer table, at the lower stage. The substrate table unit is designed to move vertically. The OUT-side wafer table and the IN-side wafer table are laid one on top of the other. This arrangement saves the floor space and prevents the system from getting too large even if the diameter of a wafer gets larger.

Because the first wafer table 34 and second wafer table 35 move up and down to the specific delivery position, the transfer arm 12a of the exposure machine 12 can place the processed wafer W and receive the unprocessed wafer W in the same position. Since the substrate table unit 33 can stop at any height, even if the wafer delivery position (or height) of the transfer arm 12a of the exposure machine 12 differs, the wafer delivery position can be adjusted to the wafer delivery position (or height) of the transfer arm 12a of the exposure machine 12 by just controlling the substrate table unit 33 of the interface section 13.

Because in the embodiment, the wafer carriage 32 can access the substrate table unit 33 obliquely, not face-to-face, when the wafer carriage 32 transfers the wafer between the extension machine (EXT) and the substrate table unit 33 in the fourth processing machine group G4, the distance over which the wafer moves along the transfer path 31 can be made shorter than before. This shortens the transfer time and prevents dust from being produced during the transfer.

In the coating and developing system 1 of the embodiment, the cassette station 10 and interface section 13 can slide in the direction of X in FIG. 1. This facilitates the maintenance of the cassette station 10, the interface section 13, and even the exposure machine 12.

While in the coating and developing system 1, the separately provided peripheral exposure machine 36 performs a peripheral exposure process on a wafer, the peripheral exposure machine 36 necessary for the peripheral exposure process may be added to the first wafer table 34 as shown in FIG. 2 or second wafer table 35 and the peripheral exposure process be carried out at the first wafer table 34 or second wafer table 35. With this configuration, the transfer distance from the extension machine (EXT) to the peripheral exposure machine can be eliminated. This shortens the processing time as a whole and suppresses the generation of dust. The elimination of the transfer distance further shortens the time during which the wafer is exposed to the ambient atmosphere, which improves the yield.

Figure 7:
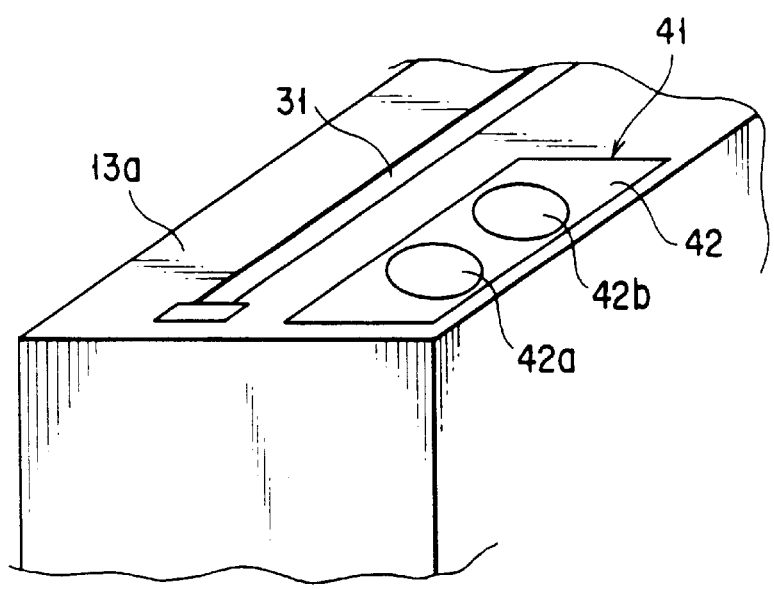
FIG. 7 is a partially perspective view of the interface section with two placement tables arranged side by side.
Figure 8:
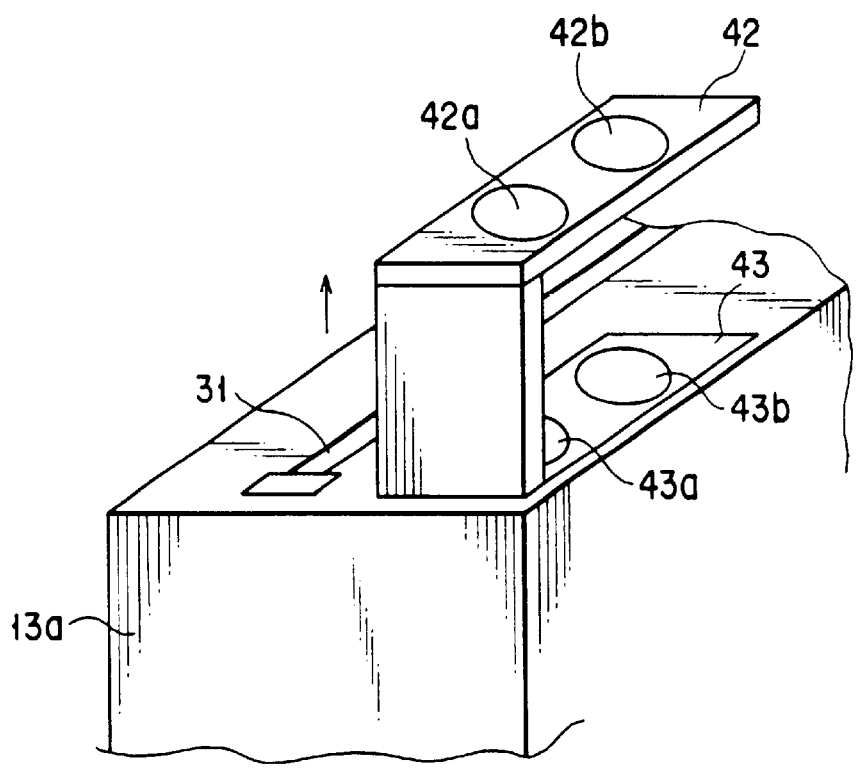
FIG. 8 is a partially perspective view of the interface section when the substrate table unit has risen.
Figure 9:
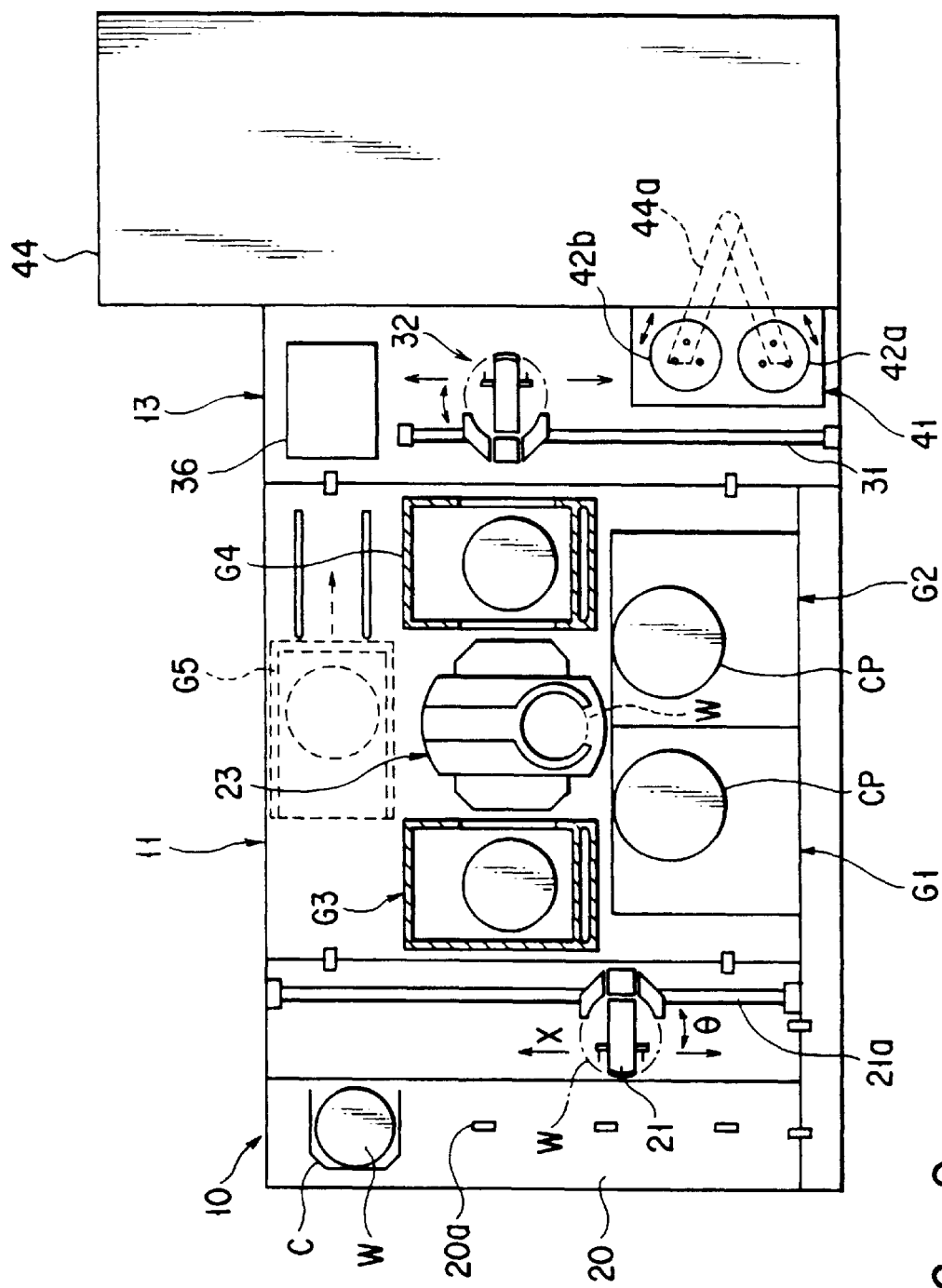
FIG. 9 is a schematic plan view of the coating and developing system using the substrate table unit of FIG. 7.

While in the coating and development system 1, each of the first wafer table 34 and second wafer table 35 in the substrate table unit 33 enables only one wafer to be placed on it, it may have a structure that enables more than one wafer (e.g., two wafers) to be placed as the substrate table unit 41 in each of FIGS. 7 and 8 does.

Specifically, in the substrate table unit 41, the first wafer table 42 at the upper stage has two placement tables 42a and 42b side by side and the second wafer table at the lower stage has two placement tables 43a and 43b side by side. This structure enables each of the first wafer table 42 and second wafer table 43 to place two wafers at the same time. Therefore, for example, in the first wafer table 42 at the upper stage, the placement table 42a is used as an IN-side placement table and the placement table 42b is used as an OUT-side placement table. Similarly, in the second wafer table 43 at the lower stage, the placement table 43a is used as an IN-side placement table and the placement table 43b is used as an OUT-side placement table. This enables the substrate table unit 41 to deal with more wafers at a time than the substrate table unit 33, which provides the function of, for example, adjusting the tact time and giving wafers a standby area.

Use of the substrate table unit 41 enables the transfer arm 44a of the pattern exposure machine 44 to place the exposed wafer W on the right table and receive the unexposed wafer W from the left table or vice versa.

As with the substrate table unit 33, the wafer carriage 32 is controlled so as to access, for example, the two placement tables 42a and 42b in the first wafer table 42 at the upper stage obliquely, not face-to-face, as shown in FIG. 10. This not only shortens the transfer distance along the transfer path 31 and the transfer time in transferring the wafer between the extension machine (EXT) and substrate table unit 41 in the fourth processing machine group G4 but also suppresses the generation of dust due to the transfer. As shown in FIG. 11, the wafer carriage may be designed to access the placement tables 42a, 42b of the first wafer table 42 in the substrate table unit 41 face-to-face.

The placement tables 42a, 42b of the first wafer table 42 in the substrate table unit 41 may be used as placement tables on the IN side or the OUT side and the placement tables 43a, 43b of the second wafer table 43 may be used as placement tables on the OUT side or the IN side. Because the first wafer table 42 and second wafer table 43 in the substrate table unit 41 allow two wafers to be placed at the same time, the necessary structure for the peripheral exposure process of wafers may be added to, for example, either the placement table 42a or placement table 42b in the first wafer table 42, and the peripheral exposure process be carried out at either the placement table 42a or placement table 42b. The same is true for the second wafer table 43.

Although the embodiment is a system that performs a coating and developing processes on a wafer in the photoresist processing step, the present invention is not limited to this. For instance, the invention is applicable to a processing system that transfers substrates, such as wafers, between a system provided with a processing machine and another machine outside the system via an interface. Substrates are not limited to wafers and may be LCD substrates, CD substrates, photomasks, various types of printed-circuit boards, or ceramic substrates.

With the above embodiment, the processing system enables the transfer means of an external processing machine to transfer and receive a wafer smoothly. Because the first wafer table and second wafer table are laid one on top of the other and the substrate table unit on which those wafer tables are installed can move up and down freely, a wafer can be loaded onto and unloaded from the first wafer table and second wafer table in the same delivery position. The space necessary for the installation of the system can be minimized.

Because the wafer tables are arranged one on top of the other and can move up and down, the transfer means of the external processing machine can receive a substrate and deliver the processed substrate from the external processing machine by means of the substrate table unit of the same height. When the processing tact time on the system side differs from that on the external processing machine side, the substrate table unit can be moved up and down suitably to place the substrate on any empty wafer table, thereby allowing the substrate to wait for processing. Since the up-and-down movement of the substrate table unit carries out the standby procedure, it is not necessary to move the transfer means on the external processing machine side and the transfer means on the system side up and down.

Because the first wafer table and second wafer tables each have a structure that allows two or more substrate to be placed on it, the first wafer table or second wafer table can be used as a standby section. Therefore, it is possible to adjust the processing time control, or the tact time.

The first wafer table or second wafer table is designed to perform an exposure process on the substrate on it. When the first wafer table or second wafer table is further designed to perform another exposure process on the substrate, for example, a peripheral exposure process on a substrate, such as a semiconductor wafer, this will not only allow the processing space to be used for two different types of exposure but also enable the processes ranging, for example, from the peripheral exposure process to the pattern exposure process or from the pattern exposure process to the peripheral exposure process to be carried out speedily.

Additional advantages and modifications will readily occurs to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A processing system comprising:
   a plurality of types of internal processing machines that perform various processes on a substrate; and
   an interface section that delivers and receives said substrate to and from an external processing machine for performing a specific process on said substrate, wherein
   said interface section includes:
      a transfer unit for taking in said substrate from at least one of said internal processing machines and transferring the substrate to said external processing machine; and
      a substrate table unit arranged adjacent to the external processing machine for temporarily holding said substrate in transferring said substrate between said interface section and said external processing machine via said transfer unit, and
      said substrate table unit has first and second tables that are laid one on top of the other and can move up and down and stop at a specific height, said first table allowing said substrate to be temporarily placed on it in transferring said substrate to said external processing machine, said second table allowing said substrate to be temporarily placed on it in receiving said substrate from said external processing machine, and said transfer unit transferring said substrate between said first and second tables and at least one of said internal processing machines.

2. A processing system according to claim 1, wherein said transfer unit can rotate freely and access said internal processing machines and said external processing machine arbitrarily.

3. A processing system according to claim 1, wherein said transfer unit can access said first table and said second table obliquely.

4. A processing system according to claim 1, wherein each of said first table and said second table includes an up-and-down support member that moves up and down, a support base part of which is stuck to the up-and-down support member, a plurality of periphery support sections that are provided on the support base and support the periphery of said substrate, and a plurality of support pins provided in the vicinity of the center of said support base, with said substrate being supported by said support pins in the vicinity of said substrate's center and the periphery being supported by said periphery support sections.

5. A processing system according to claim 1, wherein said first table is located at the upper stage and said second table is located at the lower stage.

6. A processing system comprising:
   a plurality of types of internal processing machines including at least one photoresist coating machine that perform at least a photoresist coating process on a semiconductor substrate; and
   an interface section that delivers and receives said semiconductor substrate to and from an external exposure machine for performing an exposure process on said substrate subjected to the photoresist coating process, wherein
   said interface section includes:
      a transfer unit for taking in said substrate from said photoresist coating machine and transferring the substrate to said external exposure machine; and
      a substrate table unit arranged adjacent to the external exposure machine for temporarily holding said substrate in transferring said substrate between said interface section and said external exposure machine via said transfer unit, and
      said substrate table unit has first and second tables that are laid one on top of the other and can move up and down and stop at a specific height, said first table allowing said substrate to be temporarily placed on it in transferring said substrate to said external exposure machine, said second table allowing said substrate to be temporarily placed on it in receiving said substrate from said external exposure machine, and said transfer unit transferring said substrate between each of said first and second tables and at least one of said processing machines.

7. A processing system according to claim 6, wherein said interface section has a peripheral exposure machine that performs a peripheral exposure process on said substrate, in a portion close to the end opposite to said substrate table unit.

8. A processing system according to claim 7, wherein said transfer unit unloads said substrate from said peripheral exposure machine when the peripheral exposure process has been completed, and places said substrate on said first table in said substrate table unit.

9. A processing system according to claim 6, wherein said transfer unit can rotate freely and access said internal processing machines and said external exposure machine arbitrarily.

10. A processing system according to claim 6, wherein said transfer unit can access said first table and said second table obliquely.

11. A processing system according to claim 6, wherein each of said first table and said second table includes an up-and-down support member that moves up and down, a support base part of which is stuck to the up-and-down support member, a plurality of periphery support sections that are provided on the support base and support the periphery of said substrate, and a plurality of support pins provided in the vicinity of the center of said support base, with said substrate being supported by said support pins in the vicinity of said substrate's center and the periphery being supported by said periphery support sections.

12. A processing system according to claim 6, wherein said first table is located at the upper stage and said second table is located at the lower stage.

13. A processing system comprising:

a plurality of types of internal processing machines that perform various processes on a substrate; and an interface section that delivers and receives said substrate to and from an external processing machine for performing a specific process on said substrate, wherein said interface section includes:

a transfer unit for taking in said substrate from at least one of said internal processing machines and transferring the substrate to said external processing machine; and a substrate table unit arranged adjacent to said external processing machine for temporarily holding said substrate in transferring said substrate between said interface section and said external processing machine via said transfer unit, and said substrate table unit has first and second tables that are laid one on top of the other and can move up and down and stop at a specific height, each of said first table and said second table having two placement tables side by side to allow two substrates to be temporarily placed on them in transferring a substrate between said external processing machine and said interface section, and said transfer unit transferring said substrate between said first and second tables and at least one of said internal processing machines.

14. A processing system according to claim 13, wherein said transfer unit can rotate freely and access said processing machines arbitrarily.

15. A processing system according to claim 13, wherein said transfer unit can access the two placement tables of each of said first table and said second table obliquely.

16. A processing system according to claim 13, wherein each of said first table and said second table includes an up-and-down support member that moves up and down, a support base part of which is stuck to the up-and-down support member, a plurality of periphery support sections that are provided on the support base and support the periphery of said substrate, and a plurality of support pins provided in the vicinity of the center of said support base, with said substrate being supported by said support pins in the vicinity of a center of said substrate and the periphery being supported by said periphery support sections.

17. A processing system according to claim 13, wherein said first table is located at the upper stage and said second table is located at the lower stage.

18. A processing system according to claim 13, wherein said first placement table allows the substrate unloaded from said external processing machine to be temporarily placed on it and said second placement table allows the substrate loaded into said external processing machine to be temporarily placed on it.

19. A processing system according to claim 1, wherein said substrate table unit can stop at a specific height corresponding to a wafer delivery position of said external processing machine.

20. A processing system according to claim 6, wherein said substrate table unit can stop at a specific height corresponding to a wafer delivery position of said external processing machine.

* * * * *